July 31, 1962 R. G. SNOW 3,047,741

MULTIPLE CHANNEL ELECTRONIC SWITCHING CIRCUIT

Filed May 1, 1959

INVENTOR.
Robert G. Snow
BY
Townsend and Townsend
attorneys

United States Patent Office 3,047,741

Patented July 31, 1962

3,047,741
MULTIPLE CHANNEL ELECTRONIC SWITCHING CIRCUIT

Robert G. Snow, San Francisco, Calif., assignor to Mechron, San Francisco, Calif., a corporation of California Filed May 1, 1959, Ser. No. 810,490
3 Claims. (Cl. 307—88.5)

This invention relates to a new and improved electronic switching circuit.

There is in many applications a need to provide electronic switching functions which will allow information from several sources to be selectively applied to a single output bus in such a way that only one of the input lines is at any one instant connected to the output bus and in which there is an absolute minimum transient time between the switching of one channel of information to the next.

One particular application for such a switching circuit is in television broadcasting controls wherein there are a number of input channels which are available for potential broadcasting. It is necessary to be able to instantaneously select one of the many channels for broadcasts by applying a signal from the channel to the output bus. The switching circuit for such an application is further complicated by the fact that the transfer should occur at the instant that the particular message from the connected channel reaches its logical termination so that programing continuity will be maintained in the television broadcast. Such a need implies the provision of an output pulse provided by the message source itself which can be used to trigger the switching circuit so as to effect the change at the termination of the message.

It is accordingly an object of this invention to provide a switching circuit which will, upon the receipt of a trigger pulse, gate one input channel to a common bus and simultaneously gate another channel which was previously in contact with the input bus in an off position.

It is a further object of this invention to provide such a device with sufficient linearity, speed and band pass to allow the device to be satisfactorily used for such functions as switching video information.

Another object of this invention is to provide a switching circuit which affords open circuits and closed circuit paths for a wide band of frequencies with high isolation of unwanted signal, negligible disturbance of impedance match with minimum switching transients.

Still another object of this invention is to provide a switching device which will allow switching of any selected one of a plurality of input channels to an output bus in which complete channel transfer of the input signal is effected in less than a quarter microsecond and in which the isolation of the channels is better than 47 db having a substantially linear band pass from D.C. to better than 10 megacycles.

Another object of this invention is to provide a new and improved diode gate of the type having diodes connected in back to back relation through which a signal is gated by the provision of a novel bias arrangement which allows a bias to be applied through a relatively high value resistance to the two diodes to bias the diodes in the off position and in which there is provided means to bias the diodes to an on position by applying a voltage of opposite potential through a relatively low value resistance to the two diodes so that the low impedance control voltage source overcomes high impedance bias voltage source without the necessity of switching the bias voltage from the circuit.

A still further object of this invention is to provide a novel device for applying a control voltage to one of a plurality of gates so as to cause a selected one of the plurality of gates to be supplied with a control voltage which will cause the gate to be in the open position and which will remove the control and voltage to the selected gate and supply the control voltage to another selected gate at the instant a trigger pulse is applied.

Still a further object of this invention is to provide a novel circuit employing semi-conductive elements of the type which will exhibit low impedance when a voltage stress above a fixed predetermined value is applied to the device and which will retain the low impedance characteristic so long as the current value does not drop below a predetermined minimum value but which will raise in impedance value instantaneously when the current value is lowered below said predetermined value in which there is provided a plurality of control circuits each employing one of said semi-conductive devices in such a way that an increase of voltage stress of any one of the semi-conductive devices to a level sufficient to cause the device to go into the latched or low impedance state will cause a momentary reduction of current flow to a value less than that required to sustain the low impedance characteristic of any other semi-conductive device that may have been conducting.

Other objects of the present invention will become apparent upon reading the following specification and referring to the accompanying drawings in which similar characters of reference represent corresponding parts in each of the several views.

Figures 1, 2:
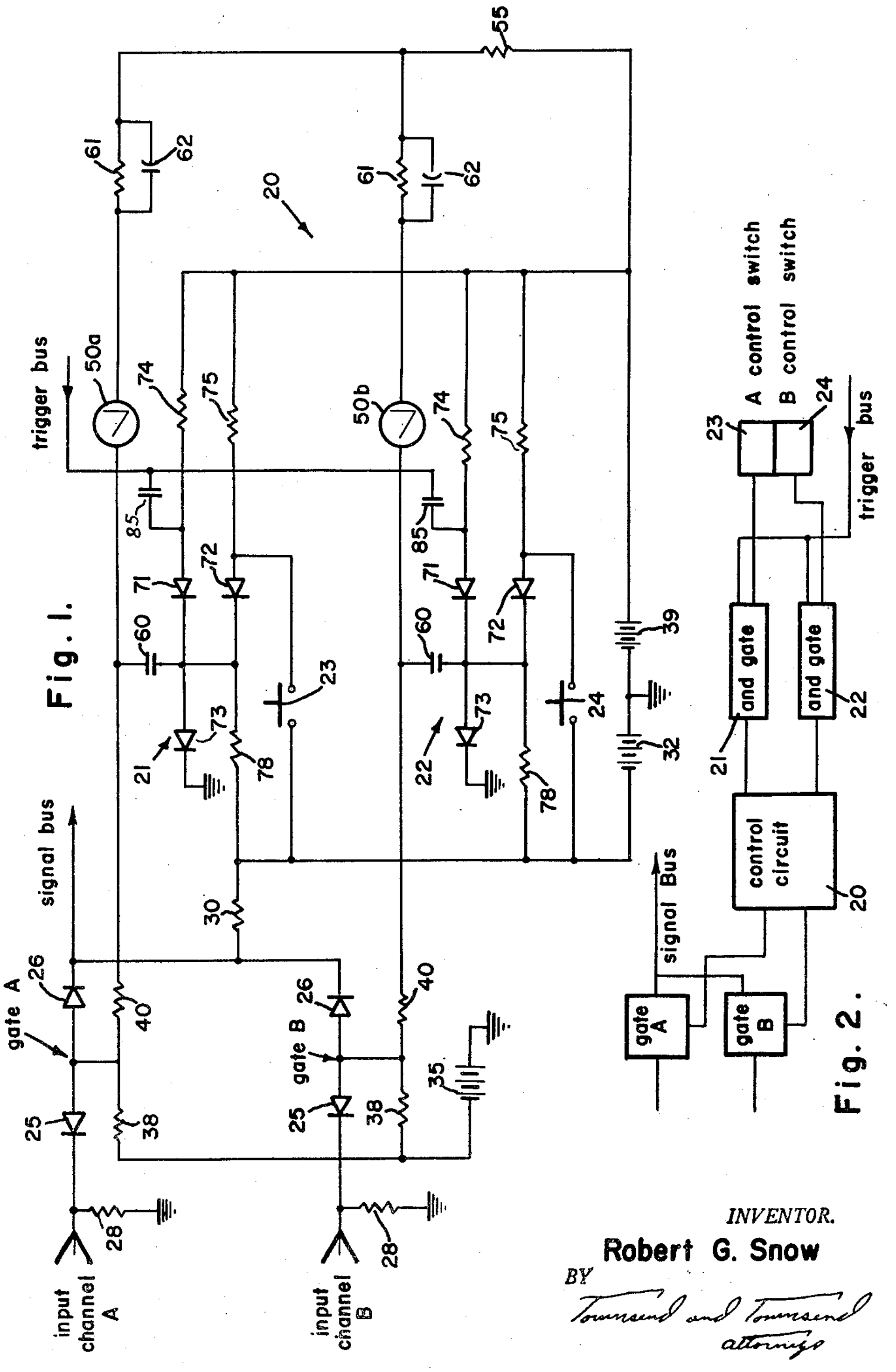
FIG. 1 is a schematic view showing a principal embodiment of the invention particularly adaptable within a television switching circuit for the switching of video signals.
FIG. 2 is a block diagram of the circuit of FIG. 1.

In FIGS. 1 and 2 there is provided, as can best be seen in the block diagram of FIG. 2, a device which will allow two channels to be selectively gated to a signal bus. It is to be understood that although the preferred embodiment is shown with only two input switches it is contemplated that the same circuit can be employed by stacking additional channels to suit the particular application. The showing of the circuit as having a two channel input is shown solely for the purpose of convenience of illustration, the principal of the circuit for additional channels remaining the same.

The input channels are designated as channels A and B. The input from channel A and channel B are applied to gate A and gate B and from gate A and gate B to the signal bus.

Gate A and gate B are normally in the closed or gated off position and are supplied with a voltage which will cause one or the other of the respective gates to open by a control circuit indicated at 20. The control circuit is arranged to selectively apply a control voltage to either gate A or gate B and to cause a switching of the control voltage from gate A to gate B or vice versa in accordance with the output of and circuits 21 and 22.

The two "and" circuits 21 and 22 are controlled by manual switches indicated at 23 and 24 respectively and a common trigger bus. Then when switch 23 is closed and while in the closed position a signal is applied on the trigger bus line then "and" circuit 21 will emit a pulse to control circuit 20 which will then switch the control voltage to gate A to cause gate A to open and simultaneously cause the control voltage to the remaining gates to terminate so that gate A is the sole gate in the open position. Thereafter when switch 24 is closed "and" circuit 22 will emit a pulse when a pulse is applied on the trigger bus line so that the control circuit 20 will cause the control voltage to shift from gate A to gate B thus causing channel B to be applied on the signal bus.

In the operation of television communication there is a negative pulse created at the termination of the logical sequence of a television message. The negative signal is applied to the trigger bus so that the "and" circuit that is conditioned by the prior closing of either switch 23 or switch 24 is arranged to emit a pulse to control circuit 20 so as to cause the effective switching from channel A to channel B or vice-versa at the instant that the logical sequence of the transmitted television signal terminates.

More specifically with reference to FIG. 1 gates A and B are each of identical circuitry. Gates A and B each comprise a diode 25 and a diode 26 which are connected back to back, with their positive terminals connected together.

The input channels A and B are connected directly to the negative terminal of diode 25. An input load resistance 28 is connected between the input source and ground. The negative terminals of diodes 26 are connected together and form the signal bus. An output load resistance 30 is connected to the common negative terminals of diodes 26 to the negative terminal of power supply 32 having its positive terminal connected to ground.

A direct or alternating current applied to the input of channels A or B will be blocked by diode 25. Diodes 26 perform further isolation of closed gates by virtue of reducing the effective capacity of the gates. Diodes 26 prevent all closed gate resistances 38 and 40 from being in shunt with the signal bus circuit and the particular open gate connected to the signal bus. A bias supply 35 is connected from ground through bias resistor 38 to the positive terminals of the diodes 25 and 26.

The output of power supply 35 supplies a negative bias on the positive terminals of the two diodes so as to bias the diodes to be nonconductive with respect to the passage of information through the diodes.

A control power supply 39 is connected with its negative terminal to ground and the positive terminal through a series of resistances and Shockley diodes, which will hereinafter be described, through control resistance 40 to the common positive terminals of diodes 25 and 26 respectively.

The power supplies 32 and 39 are of value appropriate to balance with the legs of "and" gates 21 and 22. However, the value of control resistance 40 is substantially lower than the value of resistance 38 so that while resistance 40 is effectively supplied with voltage from power supply 39 the diodes will be supplied with a positive bias which is superposed over the negative bias and of sufficient value so that the signal applied on either input channel A or input channel B will cause a voltage drop across load resistance 30 directly proportional to the signal on either input channel A or B. It can thus be seen that in this circuit the switching of voltage from control power supply 39 to control resistance 40 on either gate A or gate B will cause the gate to be biased sufficiently positive so as to render the gate in the open condition. Without voltage applied in resistance 40 the gate will be biased in the negative or closed position. It is to be observed that the relationship of the gates is such that the current path of any open gate is supplied at the common signal bus through common load resistance 30 and the load resistance power source 32.

The control circuit to cause the switching of voltage to either gate A or gate B comprises a diode 50 of the NPNP type commonly referred to as a Shockley diode in series with load resistance 40 and power source 39. The Shockley or NPNP diodes 50 are semi-conductive devices of the type which normally offer extremely high impedance except under conditions wherein there is a sufficient current flow through the diode to cause the diode to go into a latched or low impedance condition. The Shockley or NPNP type diode is characterized as being a four layer trigger diode composed of NPNP semiconductive material which exhibits the characteristics of low impedance when a sufficient current is caused to flow between the semi-conductor layers and high impedance when the current is allowed to be less than the value required to sustain this low impedance state. The Shockley or NPNP diode requires a greater voltage stress to cause the diode to shift from a high impedance condition to its low impedance condition and while in the low impedance condition will remain in that condition under less voltage stress so that it requires a substantially less holding voltage to hold or bias the Shockley diode in a latched condition.

The switching to cause the power from source 39 to the respective resistance 40 is thus controlled by causing Shockley diodes 50 to go into their respective latched and unlatched condition. To effectuate such control a resistance 55 is placed in series with the Shockley diodes and is selected in value to provide for each diode sufficient current flow to retain the latched diode in latched condition but insufficient voltage to cause the diode to go from an unlatched condition into the latched condition. The holding current is supplied to the conducting Shockley diode from both batteries 32 and 39 through respective diode 26, load resistance 30, resistances 40, 61 and common resistance 55 in conjunction with a path from single battery 39 through resistance 28, diode 25 and resistances 40, 61 and 55. The stressing or bias voltage is supplied to the non-conducting Shockley diodes from batteries 35 and 39 through resistances 38, 40, 61 and 55 and is equal to the sum of supplies 35 and 39 less the IR drop of resistor 55.

"And" circuits 21 and 22 are arranged to supply a negative pulse through condensers 60 to pulse the Shockley diodes with sufficient voltage to complement the biasing voltage to raise the voltage momentarily to bring the Shockley diodes to sufficient voltage stress to cause the Shockley diodes to shift to the latched or low impedance condition. Thus a pulse applied at either of the condensers 60 will cause the connected diode 50 to go into the latched condition.

In order to cause the required condition wherein one and only one of the Shockley diodes will at any one time be in the latched condition, parallel RC circuits comprising a resistance 61 and a condenser 62 are arranged in series with each of the diodes. Thus if, for example, the diode for gate A, indicated at $50^a$, is in a latched condition and a pulse is applied on diode $50^b$ then diode $50^a$ would immediately drop to the unlatched condition and diode $50^b$ would be in the latched or low impedance condition. This is caused due to the fact that when diode $50^b$ is latched there is sufficient voltage change caused by diode $50^b$ transmitted through condensers 62 for diode $50^b$ and 62 for diode $50^a$ to cause a lowering of the potential across the series diode $50^a$ and its associated resistor 40 to a value where the junction of diodes 25 and 26 is forced at or below ground potential thus destroying conduction of gate A. Since resistor 38 is of a sufficiently high value to prohibit the minimum required holding current to flow in the Shockley diode, diode $50^a$ will transfer to the high impedance or unlatched state. The circuit through condenser 60 offers sufficient reactance to prevent an appreciable circuit path prior to the instant the Shockley diode is unlatched. Thus diodes $50^a$ and $50^b$ are alternately rendered in the latched and unlatched condition by alternate application of pulses to condensers 60.

"And" circuits 21 and 22 provide the pulse output to condenser 60 and comprise a pair of input diodes 71 and 72 and a return diode 73. The negative terminal of input diodes 71 and 72 are connected to the positive terminal of diode 73. The negative terminals of diodes 73 are connected to ground. The positive terminals of diodes 71 and 72 are each connected through load resistances 74 and 75 to the positive terminal of power supply 39. The common terminals of the diodes are connected through a resistor 78 to the negative terminal of power supply 32. Normally the condition of the diodes is such that a negative pulse applied to the positive terminal of either diode 71 or diode 72 would have no effect in creating a pulse output through condenser 60 due to the effective bias of the opposite input diode.

In order to cause an input pulse on diodes 71 to become effective to cause a pulse across condenser 60, control switches 23 and 24 for the A and B controls respectively are arranged to shunt the circuit between the positive terminal of diode 72 and the negative terminal of battery 32. Switches 23 and 24 thus condition "and" circuits 21 and 22 to pass a negative pulse through diode 71 to cause a corresponding pulse output to condenser 60. A common trigger bus is connected through capacitors 85 to the positive terminals of diode 71.

In operation signals are continuously applied on input channels A and B. Normally the bias created by power supply 32 through resistance 38 causes gates A and B both to be in the off or non-conductive condition so that there is no output on the common signal bus. When switch 23 is closed, "and" circuit 21 is conditioned to allow a negative pulse from the trigger bus to pass through condenser 60 to cause the Shockley diode 50$^a$ to be brought into the latched condition which in turn provides a positive bias on gate A thus causing the input from channel A to be seen across load resistance 30 providing a corresponding signal to the signal bus. Thereafter when switch 23 is open the condition remains in status quo.

To cause the input of channel B to appear across the signal bus, switch 24 is closed hereinafter when a pulse occurs on the trigger bus "and" circuit 22 will emit a pulse through condenser 60 through diode 50$^b$ thus causing the diode to go into the latched condition and at the same time causing the voltage change across diode 50$^b$ to bring diode 50$^a$ into the unlatched condition. With diode 50$^b$ in the latched condition a positive control voltage is applied to the diodes 25 and 26 of gate B thus causing a signal corresponding to the input of channel B to appear on the signal bus. Subsequent reversal of channels is obtained by either closing switches 23 or 24 so as to arm the "and" circuit for subsequently passing a trigger pulse to the Shockley diode.

The trigger pulse in a television application is generated at the end of a logical program sequence so that the circuit responds to shift channels at the instant of termination of the television program material of a particular channel.

It is to be understood while this circuit has been described primarily for use in control of television communications that the device may be used just as conveniently for other applications. The circuit has demonstrated its ability to function within the range of from D.C. to 10 megacycles and provides at least 47 db separation between channels. The switching time for the circuit has been found to be approximately one-fourth of a microsecond.

For purposes of claim terminology the term NPNP diode is intended to mean a diode of the Shockley type and other similar semiconductor devices of NPNP construction that have the characteristic of avalanche breakdown at the junctions of semiconductor materials thus permitting a controllable change of the NPNP semiconductor from a high impedance state to a low impedance state.

Although the foregoing invention has been described in some detail by way of illustration and example for purposes of clarity of understanding, it is understood that certain changes and modifications may be practiced within the spirit of the invention as limited only by the scope of the appended claims.

What is claimed:

1. A control device for switching voltage to one of a plurality of output lines from a fixed voltage source comprising: a plurality of NPNP diodes each connected between the voltage source and one of the output lines; bias means to supply sufficient current flow through a first said diode to hold said first diode in a low impedance condition and to bias all said NPNP diodes with a first voltage being insufficient to switch the NPNP diodes from a condition of high impedance to a condition of low impedance; means to pulse a second NPNP diode with sufficient voltage to supplement said biasing voltage to change the diode from the high impedance condition to the low impedance condition; means connected to said NPNP diodes and said first voltage supply to cause the majority of current to pass through the second NPNP diode at the instant when the second NPNP diode changes to the low impedance condition to lower the current flow through the first NPNP diode sufficiently to drop the current flow through said first NPNP diode to a value below the current required to maintain the first NPNP diode in the low impedance condition.

2. A control device for switching voltage to one of a plurality of output lines from a fixed voltage source comprising: a plurality of NPNP diodes each connected between the voltage source and one of the output lines; biasing means including said voltage source to bias said NPNP diodes with a first voltage stress being insufficient to switch the NPNP diodes from a condition of high impedance to a condition of low impedance; pulse means to pulse selected NPNP diodes with sufficient voltage to supplement said biasing voltage to cause sufficient voltage stress across the selected doide sufficient to change the diode from the high impedance condition to the low impedance condition; said biasing means including means to pass sufficient current through a pulsed diode to maintain the pulsed diode in the low impedance condition after termination of the pulse; means connected to said NPNP diodes and said voltage supply to cause the substantial current flow to be momentarily diverted from prior conducting NPNP diode and through the pulsed NPNP diode at the instant when the pulsed NPNP diode changes to the low impedance condition for sufficient time to drop the current through said prior conducting NPNP diode below the value required to hold the NPNP diodes in the low impedance condition; said pulse means having a plurality of gate means; each said gate means connected to one of said NPNP diodes; pulse supply means to supply simultaneous pulses to each of said gate means; control means normally biasing said gate means in the off condition; and means to selectively condition each said control means to permit pulses from the pulse supply means to be pressed through said gate means to the connected NPNP diode.

3. In a switching device the combination of: a plurality of diode gates; means to provide a signal input to each of said diode gates; means connecting the output of each of said gates to a common signal bus; bias voltage supply means to bias each of said diode gates in the off position; control voltage supply means to supply a superposed voltage of opposite polarity across said bias voltage supply means; said control means being of sufficiently lower impedance than said biasing means to overcome the bias and bias the gate to the open condition; switching means to selectively cause said control means to alternately actuate selected gate means; said switching means including a plurality of NPNP diodes; one of said NPNP diodes operative to control each of said gates; means to bias all said NPNP diodes with bias voltage lower than the voltage stress required to cause said NPNP diodes to transfer from the high to the low impedance condition; means to selectively gate pulses to NPNP diodes with sufficient voltage to raise the voltage across the NPNP diode to sufficient stress to cause the pulsed NPNP diode to transfer from a high impedance to a low impedance condition; reset means connected to all said NPNP diodes to cause the current through all the said NPNP diodes except the pulsed NPNP diode to momentarily drop to a value below that sufficient to hold the NPNP diode in the low impedance condition; said reset means actuated by a momentary diversion of current flow through the pulsed NPNP diode when changing from a high to a low impedance condition; said pulse gate means comprising an "and" gate having two input terminals; means to apply pulses simultaneously to one input terminal of all of said gates; and separate circuit breaker means connected to the other input terminal of each said gate to normally condition the gate in the off position and operable to condition the gate to gate pulses from said common line to the NPNP diode.

References Cited in the file of this patent

UNITED STATES PATENTS

| | | |
|---|---|---|
| 2,761,130 | Kibler | Aug. 28, 1956 |
| 2,782,303 | Goldberg | Feb. 19, 1957 |
| 2,889,537 | Elliott | June 2, 1959 |
| 2,894,125 | Toy | July 7, 1959 |
| 2,905,837 | Barry | Sept. 22, 1959 |
| 2,964,657 | Page | Dec. 13, 1960 |